United States Patent [19]
Blaker et al.

[11] Patent Number: 5,471,500
[45] Date of Patent: Nov. 28, 1995

[54] SOFT SYMBOL DECODING

[75] Inventors: David M. Blaker, Emmaus; Gregory S. Ellard, Forest Park; Mohammad S. Mobin, Whitehall, all of Pa.

[73] Assignee: AT&T IPM Corp., Coral Gables, Fla.

[21] Appl. No.: 208,156

[22] Filed: Mar. 8, 1994

[51] Int. Cl.⁶ .................................................. H04L 27/06
[52] U.S. Cl. ............................................. 375/340; 371/43
[58] Field of Search .............................. 375/94, 39, 340, 375/341, 262; 371/43

[56] References Cited

U.S. PATENT DOCUMENTS

| | | | |
|---|---|---|---|
| 4,240,156 | 12/1980 | Doland | 371/43 |
| 4,346,473 | 8/1982 | Davis | 371/43 |
| 4,493,082 | 1/1985 | Cumberton et al. | 371/43 |
| 4,709,377 | 11/1987 | Martinez | 375/39 |
| 5,134,635 | 7/1992 | Hong et al. | 375/94 |
| 5,144,644 | 8/1992 | Borth | 376/96 |
| 5,263,052 | 11/1993 | Borth et al. | 375/39 |
| 5,291,524 | 3/1994 | Itakura et al. | 371/43 |

Primary Examiner—Stephen Chin
Assistant Examiner—Tesfaldet Bocure
Attorney, Agent, or Firm—David L. Smith

[57] ABSTRACT

There is disclosed a soft symbol for use in a decoding process generated from a binary representation of a branch metric. When a hard decision bit is a zero, a preselected number of bits of a binary representation of the branch metric are concatenated with a hard decision bit to form the soft symbol. When the hard decision bit is a one, the ones complement of the preselected number of bits of the binary representation of the branch metric are concatenated with the hard decision bit to form the soft symbol. The concatenation function can be achieved using an exclusive OR function with the preselected bits of the binary representation of the branch metric and the hard decision bit to form the soft symbol. The hard decision bit may be selectable from more than one source.

20 Claims, 3 Drawing Sheets

SOFT SYMBOL DECODING

CROSS-REFERENCE TO RELATED APPLICATIONS

This application is related to the following previously filed, co-pending applications, each of which is incorporated herein by reference:

Application Ser. No. 08/153334, entitled "Efficient Utilization of Present State/Next State Registers", filed Nov. 16, 1993, by D. Blaker, M. Diamondstein, G. Ellard, M. Mobin, H. Sam and M. Thierbach, our docket number Blaker 3-2-3-3-4-10;

Application Ser. No. 08/152531, entitled "Variable Length Tracebacks", filed Nov. 16, 1993, by D. Blaker, G. Ellard, and M. Mobin, our docket number Blaker 4-4-4;

Application Ser. No. 08/153333, entitled "Power and Time Saving Initial Tracebacks", filed Nov. 16, 1993, by D. Blaker, G. Ellard, and M. Mobin, our docket number Blaker 6-6-6;

Application Ser. No. 08/152805, entitled "Digital Receiver with Minimum Cost Index Register", filed Nov. 16, 1993, by D. Blaker, G. Ellard, M. Mobin and H. Sam, our docket number Blaker 2-2-2-3;

Application Ser. No. 08/153405, entitled "Digital Processor and Viterbi Decoder Having Shared Memory", filed Nov. 16, 1993, by M. Diamondstein, H. Sam and M. Thierbach, our docket number Diamondstein 1-2-8;

Application Ser. No. 08/153391, entitled "Digital Signal Processor", filed Nov. 16, 1993, by D. Blaker, G. Ellard and M. Mobin, our docket number Blaker 1-1-1; and Application Ser. No. 08/152807, entitled "Digital Signal Processor", filed Nov. 16, 1993, by D. Blaker, G. Ellard, M. Mobin and M. Thierbach, our docket number Blaker 5-5-5-9.

TECHNICAL FIELD

This invention relates generally to the field of digital receivers and particularly to such receivers using soft symbol decoding.

BACKGROUND OF THE INVENTION

Although telecommunications technology originally developed using copper wires as the transmission media, there is much interest and commercial activity in wireless technology using free space as the transmission media. Wireless technology frees the user from the physical constraint of needing an electrical connection to the transmission media, and is extremely useful to people engaged in activities such as automobile driving.

Initial commercial activity developing wireless technology used analog transmission. In the interests of increasing the efficiency of spectrum utilization, digital transmission systems have been developed and it is believed that ultimately a substantial majority of wireless telecommunications will utilize digital transmission systems. Digital systems transmit information as either 0s or 1s. Accurate information transmission depends upon being able to reliably detect transmitted 1s as 1s and 0s as 0s. Accurate detection is not always a simple matter because of factors such as low received signal power and multiple transmission paths caused by reflecting objects between the transmitter and receiver. Error correction techniques have been developed to increase the accuracy of digital communications systems.

Several techniques that have been developed or utilized to improve the accuracy of the communications system will be briefly described. For example, the information may be convolutionally encoded; this technique reduces the effects of burst channel noise by interleaving the bits of the data stream, that is, the transmitted information. Accuracy of transmission is further improved by the inclusion in the bit stream of redundant bits which are used for error correction in the decoding process. An exemplary error correction scheme uses the Viterbi algorithm; use of the Viterbi algorithm is not limited to convolutional codes. See, Mobile Radio Communications, R. Steele, ed., Chapter 4 Channel Coding by Wong and Hanzo for an exposition of convolutional encoding and the Viterbi algorithm.

The Viterbi algorithm is a maximum likelihood decoding scheme that provides forward error correction. Each state is represented by a plurality of bits; the number of possible immediately preceding and following states is limited. The permitted transitions from one state to another state are defined as a branch, and a sequence of interconnected branches is called a path. As mentioned, some transitions are not permitted; when the paths resulting from the non-permitted transitions are eliminated, computational efficiency is improved. A branch metric is calculated for each branch and the metric is used to determine which paths survive and which do not survive. One type of decoding is termed hard decision or symbol decoding. In this type of decoding, the decoded symbol is forced to be either a 1 or a 0; that is, the received symbol is quantized into either a 1 or a 0. However, such a two level quantization results in information being lost. This information is retained and utilized in soft symbol or decision decoding. The signal is quantized into a plurality of levels, for example, 4, 8, 16, or more, and given a value which may be positive or negative. The absolute value or magnitude represents the degree of confidence that the signal was accurately received. Decoding now proceeds. The Viterbi decoder selects the branch metric with the largest value and the associated path; it is believed that this represents the most likely path. It is known that soft symbol decoding yields more accurate decoding than does hard symbol decoding.

A method for soft trellis decoding is described in U.S. Pat. No. 5,144,644 issued on Sep. 1, 1992 to Borth. The method described generates decisions that are based upon other decision making. The degree of confidence in a particular decision is given a relative merit which is related to the difference between the hard and soft symbol values. A transmission system using soft symbol decoding is described in U.S. Pat. No. 4,493,082 issued on Jan. 8, 1985 to Cumberton et al (Cumberton). Cumberton converts five bit words into six bit words by changing the least significant bit of the five bit word into the two least significant bits of the six bit word. These bits are convolutionally encoded and soft decision decoding is used to decide which set of bits was most likely sent.

SUMMARY OF THE INVENTION

In accordance with the present invention, a soft symbol for use in a decoding process is generated from a binary representation of a branch metric. When a hard decision bit is a zero, a preselected number of bits of a binary representation of the branch metric are concatenated with a hard decision bit to form the soft symbol. When the hard decision bit is a one, the ones complement of the preselected number of bits of the binary representation of the branch metric are concatenated with the hard decision bit to form the soft symbol. The concatenation function can be achieved using an exclusive OR function with the preselected bits of the binary representation of the branch metric and the hard decision bit to form the soft symbol. The hard decision bit may be selectable from more than one source.

DETAILED DESCRIPTION

Figure 1:
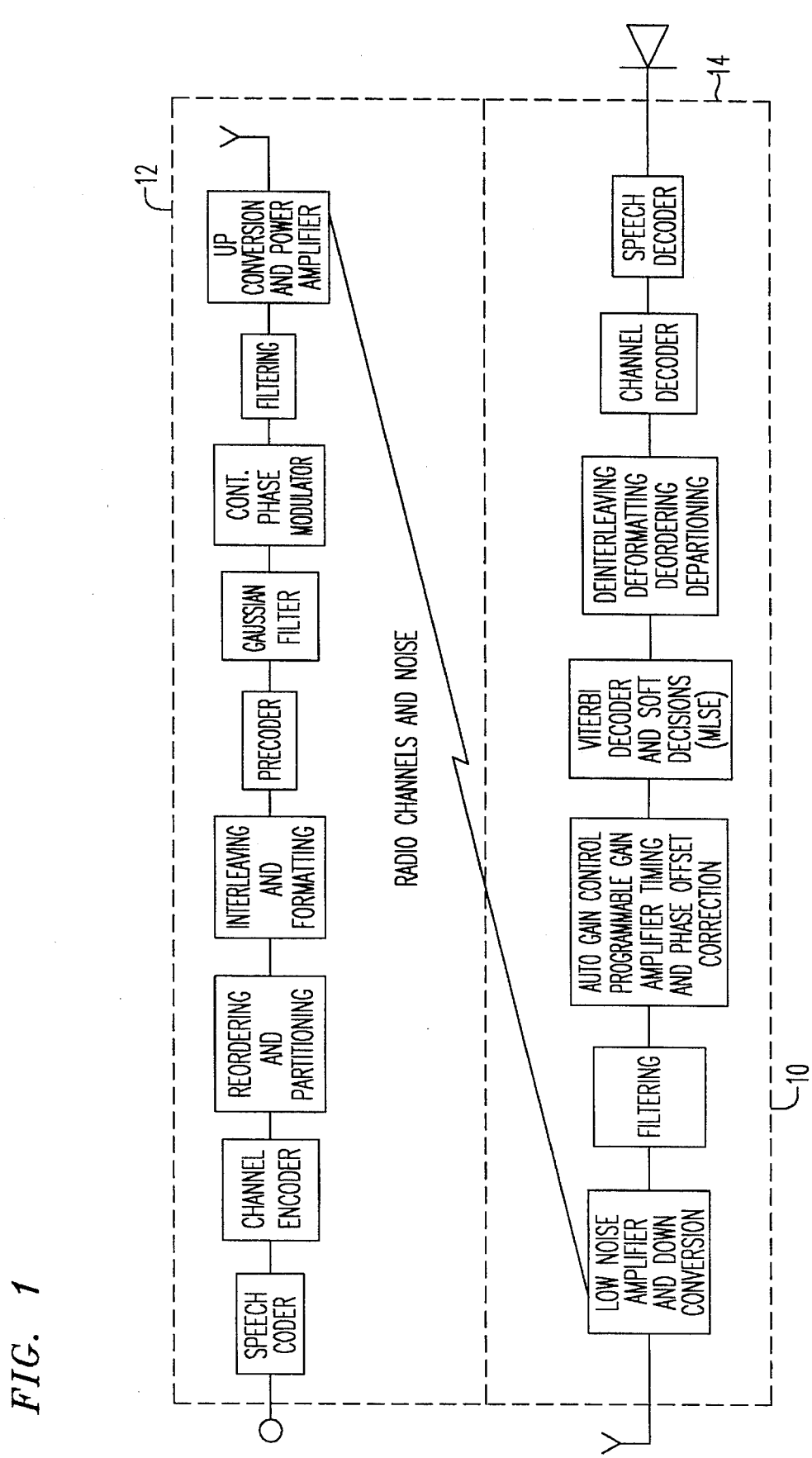
FIG. 1 is a block diagram of a transceiver.

Transceiver 10, shown in the block diagram of FIG. 1, is a communication system or portion of a communication system such as a mobile digital cellular telephone. Transceiver 10 is comprised of transmitter 12 and receiver 14.

A frame, or transmission burst, of transmitted information contains a predetermined number of bits. Each frame includes starting bits, a first set of information bits, training bits, a second set of information bits, and ending bits. Typically there are three starting and ending bits, 58 bits in each set of information bits, and 26 training bits for a total of 148 bits per frame. The training bits are known. The starting and ending bits are known and typically are zeroes. Other numbers and distribution of bits are possible depending on the implementation.

In decoding data using the Viterbi process from a series of binary data received at a decoder, the decoder generates the sequence of data most likely transmitted. The decoder considers all possible state combinations and produces estimates of signals for all possible state transitions, then compares the estimates with received data to determine what was the most likely transmitted bit sequence. The initial state of the encoder is known so, therefore, the decoder has a starting point. The end state of the encoder is also known, so the decoder also has a predetermined ending point. The decoder determines the most likely sequence of state transitions for the received series of binary data. Each such state represents a symbol instant. At each symbol instant, there are a number of states that range from 0 up to $2^{C-1}-1$ where C is the constraint length. A typical range for C would be from 2 to 7. These $2^{C-1}$ states will be referred to as individual states. A limited number of transitions are possible. At each symbol instant, the accumulated cost is calculated for each of the possible transitions. The path having an extremum (i.e., minimum or maximum) cost may thereby be determined.

At each symbol instant, each individual state can only progress to a limited number of possible next individual states. In addition, each next individual state has only a limited number of possible previous individual states from which a transition to it can originate.

A branch metric is calculated at each symbol instant for each possible transition from all possible individual states to the next individual state. Various methods for calculating branch metrics are known in the art and will be detailed below. The branch metric for all branches transitioning to a given next individual state are calculated, then added to the accumulated cost of the respective originating individual state, resulting in two or more potential accumulated cost sums. A comparison is made of the various potential accumulated cost sums. An extremum branch metric is selected as the next state accumulated cost. In one embodiment of the invention the lesser of the cost sums is selected as the next state accumulated cost. (For certain branch metric calculations, the greater of the cost sums might be selected.) The transition corresponding to the lesser sum is the more likely transition from the two possible originating individual states to the given next individual state. The originating individual state of the more likely transition is stored as the surviving origin of a branch to the given next individual state. The lesser sum is the accumulated cost of the next individual state and replaces the accumulated cost for that individual state stored in traceback RAM 23. This represents the surviving branch to the next individual state, as is known in the art. This process is repeated for each of the next individual states and repeated also for each symbol instant until all of the symbols in a burst of bits are decoded.

Figure 2:
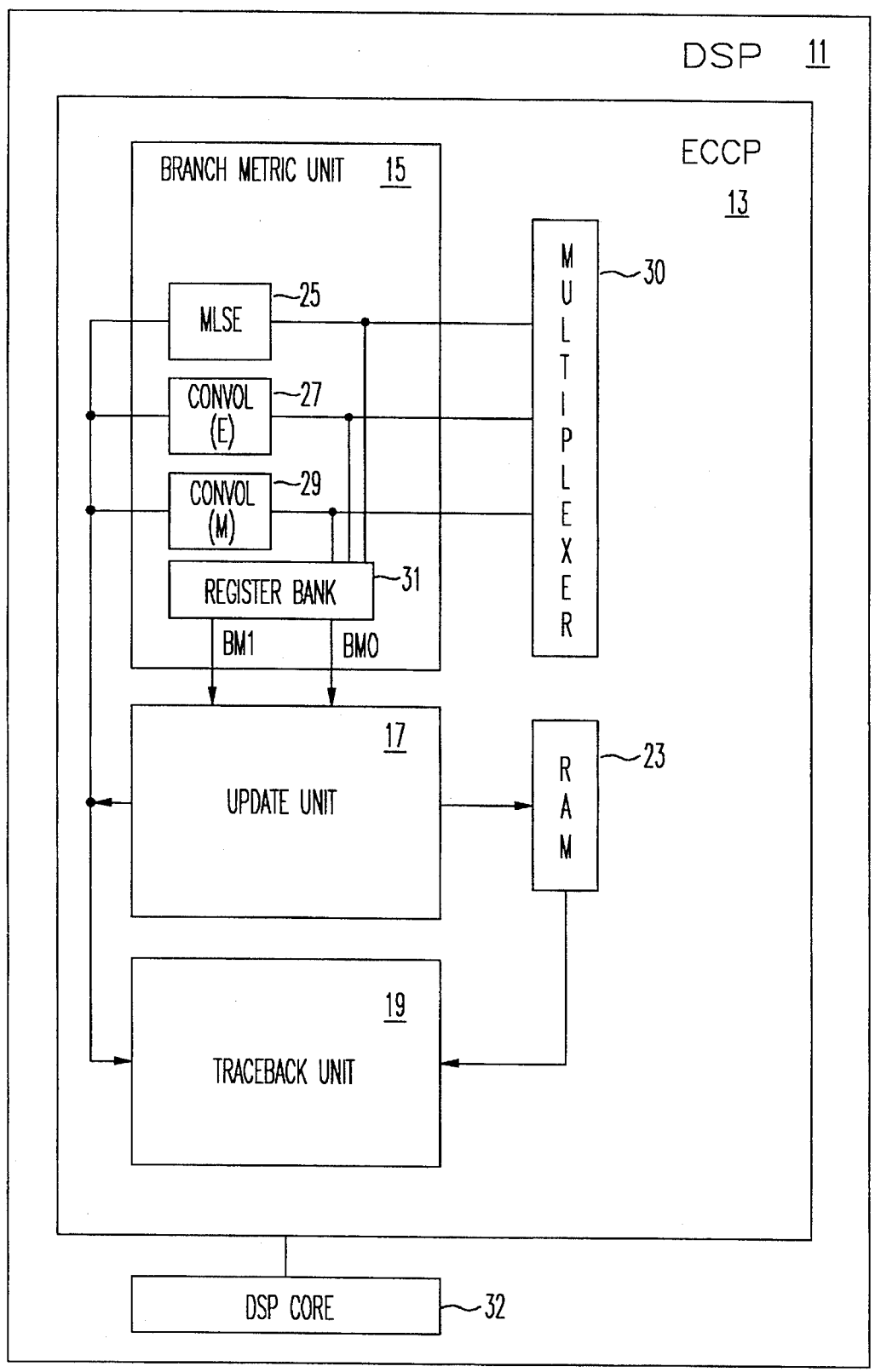
FIG. 2 is a diagram showing an environment in which the invention may be employed.

FIG. 2 is a schematic diagram of a portion of receiver 14 showing a digital signal processor (DSP) 11 having embedded error-correcting co-processor (ECCP) 13 and a DSP core 32. DSP core 32 sets the operational parameters of the ECCP 13, such as constraint length, and branch metric type, (Euclidean or Manhattan). Core 32 also initiates the Viterbi decoding function of ECCP 13.

Within ECCP 13 is update unit 17, traceback unit 19, and branch metric unit 15. Update unit 17 performs the add-compare-select operations of the Viterbi process. At every symbol instant there are $2^C$ state transitions of which $2^{C-1}$ state transitions survive. The update unit performs the add-compare-select operation and updates $2^{C-1}$ accumulated cost states in RAM 23. The update unit stores the accumulated cost of each path at whatever symbol instant is under analysis.

Traceback unit 19 selects a path having the smallest path metric among $2^{C-1}$ survivor paths at every symbol instant. The last bit of the path corresponding to the maximum likelihood sequence is delivered to the decoder output. The depth of this last bit is programmable at the symbol rate. If the end state is known, the traceback decoding may be forced in the direction of the correct path by writing the desired end state into a minimum cost index register.

Branch metric unit 15 calculates, for each symbol instant, the branch metric for each possible transition. A variety of metrics have been proposed by those skilled in the art for comparatively evaluating individual branches on the trellis. Viterbi decoders which utilize branch metric units may be capable of performing the Viterbi process utilizing a variety of metrics.

ECCP 13 may be employed to deconvolve signals which have been encoded by a convolutional encoder. In addition, ECCP 13 may be employed to provide maximum likelihood sequence estimation (MLSE) equalization.

In certain applications, ECCP 13 may be required to perform an MLSE process. (In other applications, the ECCP 13 may be required to perform a convolutional decoding as discussed below.) In wide-band width, low data rate applications, additive white gaussian noise (AWGN) is the principal channel impairment and a Euclidean branch metric provided by equation (1) is appropriate for MLSE operation. An Euclidean metric appropriate for MLSE processes is given by $$BM = (Z_I - E_I)^2 + (Z_Q - E_Q)^2 \qquad (1)$$

where
BM=branch metric
$Z_I$=received in-phase signal component
$Z_Q$=received quadrature signal component
$E_I$=estimated received in-phase component for each state transition
$E_Q$=estimated received quadrature component for each state transition Consequently, DSP core 32 selects MLSE operation metric unit 25 with an embedded Euclidean branch metric unit. Metric unit 25 performs Euclidean metric calculations on incoming signals as part of an MLSE process.

By contrast, when convolutional decoding is to be performed, either an Euclidean or a Manhattan metric may be appropriate. For example, convolutional decoding over a gaussian channel may require a Euclidean distance measure for rate ½ or ½ encoding. By contrast, convolutional decoding preceded by MLSE or other linear/non-linear equalization may require a Manhattan distance measure for code rates ½ to ⅙. For convolutional decoding with a ½ code rate, an Euclidean metric given by equation 2 may be appropriate:

$$BM=(S_O-E_O)^2 \tag{2}$$

where
BM=branch metric
$S_O$=received signal component
$E_O$=estimated signal component For convolutional decoding with a ½ code rate, an Euclidean metric given by equation 3 may be appropriate:

$$BM=(S_O-E_O)^2+(S_I-E_I)^2 \tag{3}$$

where
BM=branch metric
$S_O$=received first signal component
$S_I$=received second signal component
$E_O$, $E_I$=corresponding estimated signal component associated with each state transition By contrast, a Manhattan branch metric is provided by equation 4:

$$BM = \sum_{i=1}^{m} |S_i - E_i| \tag{4}$$

for m=1, 2, 3, 4, 5, 6 depending upon code rate which is 1/m
where
BM=branch metric
$S_i$=$i^{th}$ received signal
$E_i$=$i^{th}$ estimated signal (Note: higher values of m are also permissible). Consequently, when convolutional decoding requiring an Euclidean distance measure is required, metric unit 27 calculates Euclidean metrics. However, should convolutional decoding utilizing a Manhattan metric be required, operation of metric unit 29 is invoked by DSP core 32 to perform the required metric operation. Whichever metric unit 25, 27 or 29 is selected, it calculates the appropriate metric for each incoming signal. Whichever of the three metric units, 25, 27 or 29, is utilized, the output is provided to multiplexer 30 and then used in the add-compare-select operation performed by update unit 17. Additional metric units may be employed and other metrics such as Hamming may be performed by any of the metric units.

Illustratively, the branch metric unit 15 performs full precision real and complex arithmetic for computing 16 bit branch metrics required for MLSE equalization and/or convolutional decoding. MLSE branch metric unit 25 generates an estimated received complex signal for each symbol instant, n. The received complex signal may be represented by in-phase and quadrature components indicated in equation 5:

$$E(n,k)=EI(n,k)+jEQ(n,k) \tag{5}$$

where
n=symbol instant
k=0 . . . $2^{C-1}-1$=all states taking part in Viterbi state transition
C=constraint length All possible states, k=0 to k=$2^{C-1}-1$, taking part in the Viterbi state transition are convolved with the estimated channel impulse response, H(n), which is provided by equation 6.

$$H(n)=[h(n), h(n-1), h(n-2) \ldots h(n-C+1)]^T \tag{6}$$

where
H(n)=estimated channel impulse response
h(n)=$n^{th}$ channel tap
C=constraint length Each in-phase and quadrature phase pan of the channel tap, h(n)=hi(n)+jhQ(n), may be an 8 bit twos complement number (although other representations are acceptable). To simplify data handling, the channel estimates may be normalized prior to loading into ECCP 15 such that the worst case summation of the hI(n) or hQ(n) are confined to be a 10 bit two's complement number (although other representations are possible). In addition, the in-phase and quadrature phase pans of the received complex signal, Z(n)=ZI(n)+jZQ(n) are also confined in a similar manner to be a 10 bit twos complement number. The Euclidean branch metric associated with each of the $2^C$ state transitions, originally expressed as equation 1, may be rewritten as:

$$BN(n,k)=XI(n,k)^2+XQ(n,k)^2 \tag{7}$$

where
$XI(n,k)$=abs $\{ZI(n)-EI(n,k)\}$
$XQ(n,k)$=abs $\{ZQ(n)-EQ(n,k)\}$ where XI, and XQ have an upper saturation limit of 0xFF (=$255_{10}$)

To prevent the occurrence of arbitrarily large branch metrics, the values of XI and XQ are not permitted to exceed 0xFF (i.e., $255_{10}$). Thus, the absolute value designated in equation 7 is a saturated absolute value having an upper limit of 0xFF. The 16 most significant bits of this 17 bit branch metric are retained for the add-compare-select operation of the Viterbi algorithm in a manner detailed below.

The in-phase and quadrature phase parts of the received complex signal are stored in register bank 31. In addition, the complex estimated channel taps and the generating polynomials may be stored in the same register bank.

As discussed previously, two types of computation are implemented for convolutional decoding. Convolutional decoding over a gaussian channel is supported with an Euclidean metric for rate ½ and ½ convolutional encoding in unit 27. Convolutional decoding preceded by MLSE equalization or other linear/non-linear equalization is supported with a Manhattan distance measure for rates ½ through ⅙ convolutional encoding in unit 29.

Figure 3:
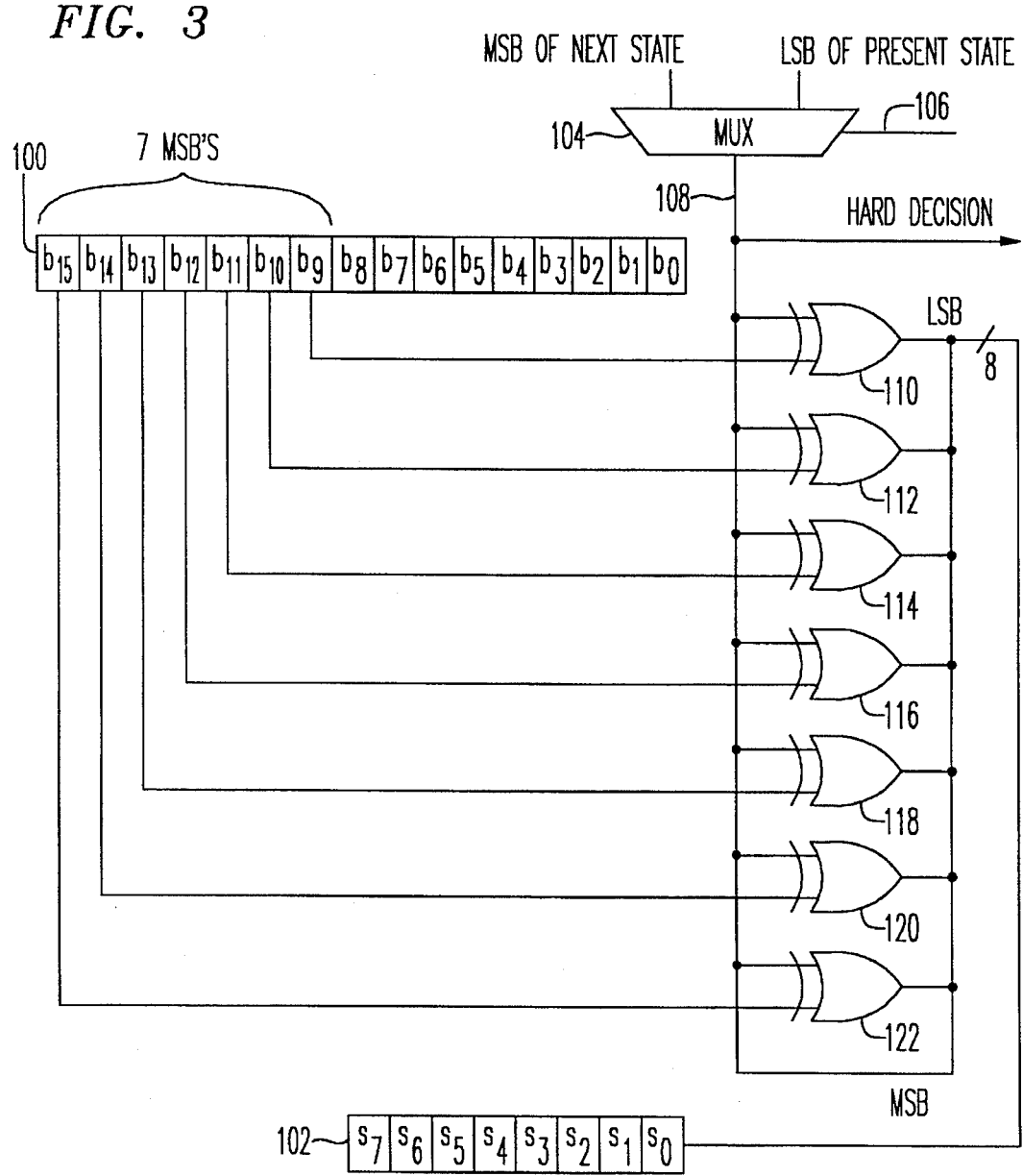
FIG. 3 is a concatenation circuit in which branch metric bits are combined with a hard decision bit to form a soft symbol.

The branch metric corresponding to the surviving transition can be converted into a binary soft symbol. FIG. 3 shows a circuit to convert a multiple bit branch metric directly into a soft symbol. Branch metric 100 is a multiple bit word. In the exemplary embodiment branch metric 100 has 16 bits of which the seven most significant bits used to generate a soft symbol 102. The invention is not limited to a 16 bit branch metric, employing the most significant bits to generate a soft symbol, or generating a soft symbol from seven bits.

In the exemplary embodiment, either the most significant bit of the next state, or the least significant bit of the present state may be used in generating a soft symbol as shown in FIG. 3. The most significant bit of the next state and the least significant bit of the present state are provided as inputs to multiplexer 104. Multiplexer 104 is responsive to select input 106 to selectively pass one of the signals appearing at the input to its output 108. The output 108 of multiplexer 104 provides a first input to each of exclusive OR (XOR) gates 110 through 122. The output 108 can alternatively be used as a hard decision. While exclusive OR gates are shown in the exemplary embodiment, it is recognized that combinatorial logic could provide the same function. The second input to each of XOR gates 110 through 122 is provided by a preselected number of the most significant bits of branch metric 100. In the exemplary embodiment shown in FIG. 3, the preselected number of bits is seven, and the preselected bits are the most significant bits, though the invention is not limited thereto. The most significant bit of branch metric 100 provides the second input to XOR 122. The least significant of the preselected number of most significant bits of branch metric 100 provides the second input to XOR 110. Output 108 from multiplexer 104 is concatenated as the most significant bit of the binary soft symbol 102. The second most significant bit of soft symbol 102 is the output of XOR 122. The least significant bit of soft symbol 100 is the output of XOR 110.

Figure 4:
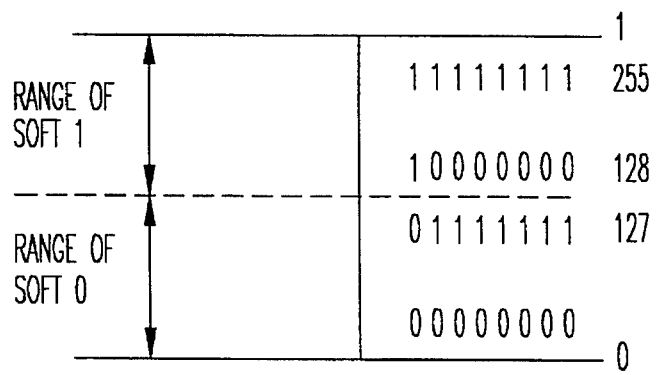
FIG. 4 is a diagram of the range of soft symbol ones and zeros.

Operation of the circuit of FIG. 3 and conversion of a branch metric to a binary soft symbol is further understood in conjunction with FIG. 4. The concatenated bits forming soft symbol 102 have a range that extends from $00000000_2$ ($0_{10}$) to $11111111_2$ ($255_{10}$). The range of soft symbol 102 representing a zero $00000000_2$ ($0_{10}$), the best zero, to $01111111_2$ ($127_{10}$), the worst case zero. The range of soft symbol 102 representing a one extends from $10000000_2$ ($128_{10}$), the worst case one, to $11111111_2$ ($255_{10}$), the best case one.

Output 108 determines whether a soft symbol represents a soft zero or a soft one. The hard decision bit positions the soft symbol on the appropriate side of the transition from a zero to one. The boundary between a zero and a one is determined by the most significant bit of the soft symbol.

When output 108 is a zero, the output of each XOR 110 through 122 is the same as the bit of branch metric 100 received at the second input of each exclusive or gate. In this manner, soft symbol 102 is constructed with output 108 as the most significant bit, concatenated with the preselected number of most significant bits of branch metric 100, here seven.

When output 108 is a one, the output of each XOR 110 through 122 is the ones complement of the bit of branch metric 100 received at the second input of each exclusive or gate. In this manner, soft symbol 102 is constructed with output 108 as the most significant bit, concatenated with ones complement of the most significant bits of branch metric 100. The ones complement reflects the confidence level information across the line of demarcation between a zero and a one.

A soft symbol generated in accordance with the present invention does not include any negative numbers in the range of soft symbol zeros and ones and therefore does not require any twos complement binary representations. Soft symbols generated in accordance with the present invention can be used in subsequent signal processing to obtain higher performance. Soft decision decoding improves the coding gain of the overall system in which soft symbol decoding is employed.

The invention is particularly useful in communication systems and equipment employing integrated circuits including this technique. Such communications systems and equipment have the advantage of reduced complexity of circuitry to accomplish the signal processing. Soft symbols in accordance with the present invention do not require twos complement arithmetic.

While the illustrative embodiment of the invention has not been described as incorporating pipelining, one skilled in the art would recognize the enhanced computational efficiency available by utilizing pipelining in the design. Pipelining is achieved by initiating computation with a new data set before completing computations with a previous set of data. The more latches used in pipelining, the greater the depth of pipelining. Pipelining causes an initial latency in computation time required to fill the pipeline, but maximizes usage of resources such as adders and subtractors.

We claim:

1. A method of generating a soft symbol for use in decoding a received digital signal into bits that are ones and zeroes, the soft symbol being generated from bits of a binary representation of a branch metric, the method comprising the steps of:

generating a hard decision bit associated with a state;

concatenating a preselected number of said bits of a binary representation of the branch metric with the hard decision bit to form the soft symbol when the hard decision bit is a first value; and concatenating the ones complement of a preselected number of said bits of a binary representation of the branch metric with the hard decision bit to form the soft symbol when the hard decision bit is not the first value.

2. A method as recited in claim 1, wherein the step of concatenating a preselected number of said bits of a binary representation of the branch metric with the hard decision bit to form the soft symbol when the hard decision bit is a first value, further comprises the step of:

selecting the preselected number of bits as the most significant bits of the binary representation of the branch metric.

3. A method as recited in claim 1, wherein the step of concatenating the ones complement of a preselected number of said bits of a binary representation of the branch metric with the hard decision bit to form the soft symbol when the hard decision bit is not the first value, further comprises the step of:

selecting the preselected number of bits as the most significant bits of the binary representation of the branch metric.

4. A method of generating a soft symbol for use in decoding a received digital signal into bits that are ones and zeroes, the soft symbol being generated from bits of a binary representation of a branch metric, the method comprising the steps of:

generating a hard decision bit associated with a state;

concatenating the ones complement of a preselected first number of bits of a binary representation of the branch metric with the hard decision bit to form the soft symbol when the hard decision bit is one; and concatenating a preselected second number of bits of a binary representation of the branch metric with a hard decision bit to form the soft symbol when the hard decision bit is not one.

5. A method as recited in claim 4, wherein the step of concatenating the ones complement of a preselected number of bits of a binary representation of the branch metric with a hard decision bit to form the soft symbol when the hard decision bit is a one further comprises the step of selecting the preselected number of bits as the most significant bits of the binary representation of the branch metric.

6. A method as recited in claim 4, wherein the preselected first number of bits and the preselected second number of bits are the same number of bits.

7. A method as recited in claim 4, wherein the preselected first number of bits and the preselected second number of bits are the same bits.

8. A circuit for generating a binary soft symbol for use in decoding a received digital signal into bits that are ones and zeroes, the circuit comprising:

means for receiving a hard decision bit, the hard decision bit associated with a state;

means for storing a binary representation of a branch metric associated with the state;

a plurality of exclusive OR gates corresponding in number to predetermined number of bits of the binary representation of the branch metric associated with the state, each of the plurality of exclusive OR gates having a first input to receive a bit of the binary representation of the branch metric, a second input to receive the hard decision bit, and an output, the output of the plurality of exclusive OR gates collectively providing the least significant bits of a soft symbol; and means for providing the hard decision bit as the most significant bit of the soft symbol.

9. A circuit as recited in claim 8, wherein the predetermined number of bits are selected as the most significant bits of the binary representation of the branch metric.

10. A circuit as recited in claim 8, wherein the predetermined number of bits of the binary representation of the branch metric used in generating the soft symbol is one less than the number of bits in the soft symbol.

11. A circuit as recited in claim 10, wherein the predetermined number of bits is seven.

12. A circuit as recited in claim 8 wherein the means for receiving a hard decision bit is a multiplexer, the multiplexer capable of selecting a hard decision bit from one of at least two sources.

13. A receiver for decoding a sequence of received symbols into bits that are ones and zeroes using soft symbol decoding, comprising:

means for receiving a sequence of symbols transmitted over a transmission channel;

means, responsive to the means for receiving, for calculating a branch metric for a possible transition from an individual state at one symbol instant to an individual state at a next symbol instant, the branch metric having a binary representation;

means for receiving a hard decision bit associated with one of said symbol instants;

a plurality of exclusive OR gates corresponding in number to a predetermined number of bits of the binary representation of the branch metric associated with the next symbol instant, each of the plurality of exclusive OR gates having a first input to receive a bit of the binary representation of the branch metric, a second input to receive the hard decision bit, and an output, the output of the plurality of exclusive OR gates collectively providing the least significant bits of a soft symbol; and means for providing the hard decision bit as the most significant bit of the soft symbol, whereby said soft symbol is generated from said branch metric for use in the decoding.

14. A receiver as recited in claim 13, wherein the predetermined number of bits are selected as the most significant bits of the binary representation of the branch metric.

15. A receiver as recited in claim 13, wherein the predetermined number of bits of the binary representation of the branch metric used in generating the soft symbol is one less than the number of bits in the soft symbol.

16. A receiver as recited in claim 15, wherein the predetermined number of bits is seven.

17. A receiver as recited in claim 13, wherein the means for receiving a hard decision bit is a multiplexer, the multiplexer capable of selecting a hard decision bit from one of at least two sources.

18. A circuit for generating a binary soft symbol for use in a decoding a received digital signal into bits that are ones and zeroes, the circuit comprising:

circuitry for receiving a hard decision bit, the hard decision bit associated with a state;

a register for storing a binary representation of a branch metric associated with the state;

a plurality of logic circuits corresponding in number to a predetermined number of bits of the binary representation of the branch metric associated with the state, each of the plurality of logic circuits having a first input to receive a bit of the binary representation of the branch metric, a second input to receive the hard decision bit, and an output, the output of the plurality of logic circuits collectively providing the least significant bits of a soft symbol; and circuitry for providing the hard decision bit as the most significant bit of the soft symbol.

19. A circuit as recited in claim 18, wherein the circuitry for receiving a hard decision bit is a multiplexer, the multiplexer capable of selecting a hard decision bit from one of at least two sources.

20. A circuit as recited in claim 18 wherein at least one of the plurality of logic circuits is an exclusive OR gate.

* * * * *